US008900674B2

(12) United States Patent
Borrello et al.

(10) Patent No.: US 8,900,674 B2
(45) Date of Patent: Dec. 2, 2014

(54) METHOD OF COATING A SUBSTRATE

(75) Inventors: Daniel Borrello, Cortaillod (CH);
Evelyne Vallat-Sauvain, Chezard-St. Martin (CH); Ulrich Kroll, Corcelles (CH); Johannes Meier, Corcelles (CH)

(73) Assignee: Tel Solar AG, Trubbach (CH)

( * ) Notice: Subject to any disclaimer, the term of this patent is extended or adjusted under 35 U.S.C. 154(b) by 172 days.

(21) Appl. No.: 13/500,565

(22) PCT Filed: Sep. 27, 2010

(86) PCT No.: PCT/EP2010/064252
§ 371 (c)(1),
(2), (4) Date: Jun. 21, 2012

(87) PCT Pub. No.: WO2011/042328
PCT Pub. Date: Apr. 14, 2011

(65) Prior Publication Data
US 2012/0266953 A1 Oct. 25, 2012

Related U.S. Application Data

(60) Provisional application No. 61/248,981, filed on Oct. 6, 2009.

(51) Int. Cl.
| | |
|---|---|
| C23C 14/02 | (2006.01) |
| C23C 16/40 | (2006.01) |
| C23C 14/08 | (2006.01) |
| H01L 31/0368 | (2006.01) |
| H01L 31/075 | (2012.01) |
| H01L 31/0376 | (2006.01) |
| C23C 16/02 | (2006.01) |
| H01L 31/0747 | (2012.01) |
| C23C 30/00 | (2006.01) |
| H01L 31/0224 | (2006.01) |
| H01L 31/18 | (2006.01) |
| H01L 31/0236 | (2006.01) |
| H01L 31/0392 | (2006.01) |

(52) U.S. Cl.
CPC ........... *C23C 16/0245* (2013.01); *Y02E 10/548* (2013.01); *C23C 14/086* (2013.01); *H01L 31/03685* (2013.01); *H01L 31/075* (2013.01); *C23C 16/407* (2013.01); *H01L 31/03762* (2013.01); *Y02E 10/545* (2013.01); *H01L 31/0747* (2013.01); *C23C 30/00* (2013.01); *C23C 14/021* (2013.01); *H01L 31/022466* (2013.01); *H01L 31/1884* (2013.01); *H01L 31/0236* (2013.01); *H01L 31/03921* (2013.01)
USPC ............................. 427/534; 427/165; 427/166

(58) Field of Classification Search
USPC ................ 427/534, 535, 165, 166, 255.23
See application file for complete search history.

(56) References Cited

U.S. PATENT DOCUMENTS

| | | | | |
|---|---|---|---|---|
| 5,308,463 | A | * | 5/1994 | Hoffmann et al. .......... 204/192.3 |
| 6,124,039 | A | * | 9/2000 | Goetz et al. .................... 428/457 |
| 6,420,032 | B1 | * | 7/2002 | Iacovangelo .................. 428/412 |
| 6,420,644 | B1 | | 7/2002 | Fukui et al. |
| 2001/0045667 | A1 | * | 11/2001 | Yamauchi et al. ............. 257/774 |
| 2002/0046766 | A1 | * | 4/2002 | Carlson et al. ................. 136/258 |
| 2003/0044539 | A1 | * | 3/2003 | Oswald ......................... 427/404 |
| 2005/0022860 | A1 | | 2/2005 | Toh |
| 2007/0238311 | A1 | * | 10/2007 | Levy .............................. 438/765 |
| 2008/0283831 | A1 | * | 11/2008 | Ryu et al. ......................... 257/43 |
| 2009/0174835 | A1 | * | 7/2009 | Lee et al. ......................... 349/46 |

FOREIGN PATENT DOCUMENTS

| | | | |
|---|---|---|---|
| EP | 1 786 047 A1 | | 5/2007 |
| JP | 1-194423 | * | 8/1989 |
| WO | WO 00/55656 | | 9/2000 |
| WO | WO 2008/153623 | | 12/2008 |

OTHER PUBLICATIONS

Hayamizu, Shunichi. et al., "Preparation of crystallized zinc oxide films on amorphous glass substrates by pulsed laser deposition". J. Appl. Phys. 80 (2), Jul. 15, 1996, pp. 787-791.*
Kluth, O., et al., "Texture etched ZnO:Al coated glass substrates for silicon based thin film solar cells". Thin Solid Films 351 (1999) 247-253.*
Gomez, Sergi, et al., "Etching of high aspect ratio structures in Si using SF6/O2 plasma". J. Vac. Sci. Technol. A 22(3), May/Jun. 2004, 606-615.*
Springer, J, et al., "Light trapping and optical losses in microcrystalline silicon pin solar cells deposited on surface-textured glass/ZnO substrates", Solar Energy Materials and Solar Cells, vol. 85, No. 1, Jan. 1, 2005, p. 1-11 (Elsevier Science.
Hongsingthong, A, et al., "ZnO Films with Very High Haze Value for Use as Front Transparent Conductive Oxide Films in Thin-Film Silicon Solar Cells", Applied Physics Express, vol. 3, No. 5, May 14, 2010 (The Japan Society of Applied Physics).
International Bureau, International Search Report for International Application No. PCT/EP/2010/064252, Jan. 20, 2011, pp. 1-3, Geneva, Switzerland.

(Continued)

*Primary Examiner* — Bret Chen
(74) *Attorney, Agent, or Firm* — Ohlandt, Greeley, Ruggiero & Perle, LLP

(57) ABSTRACT

There is provided a method of coating a substrate with a zinc oxide film. The method includes (a) providing a substrate with at least one substantially flat surface, (b) subjecting the surface at least partially to a plasma-etching process, and (c) depositing on the etched surface, a layer that includes zinc oxide. The method is particularly suitable for manufacturing solar cells.

5 Claims, 3 Drawing Sheets

(56) References Cited

OTHER PUBLICATIONS

International Bureau, Written Opinion of the International Search Authority for International Application No. PCT/EP/2010/064252, Apr. 6, 2012, pp. 1-6, Geneva, Switzerland.

International Bureau, International Preliminary Report on Patentabiltiy Chapter I for International Application No. PCT/EP/2010/064252, Apr. 11, 2012, pp. 1-7, Geneva, Switzerland.

* cited by examiner

METHOD OF COATING A SUBSTRATE

CROSS-REFERENCE TO RELATED APPLICATIONS

This application is a United States national stage entry of International Application serial no. PCT/EP2010/064252 filed Sep. 27, 2010, which claims priority to U. S. provisional patent application Ser No. 61/248,981 filed Oct. 6, 2009. The contents of both of these prior applications are incorporated herein by reference in their entirety as if set forth verbatim.

FIELD

The present invention relates to the field of thin-film coating. In particular, the invention relates to the coating of a zinc oxide film on a substrate, particularly for the purpose of manufacturing solar cells and/or solar panels.

BACKGROUND

Photovoltaic devices, or solar cells, are devices which convert light, especially sunlight, into direct current (DC) electrical power. For low-cost mass production, thin film solar cells are of interest since they allow using glass, glass ceramics or other rigid or flexible substrates instead of crystalline or polycrystalline silicon as a base material, or substrate, respectively. Various solar cell technologies are commercially available today. The possibility to process such cells at low temperatures and in a large scale is a major advantage of this technology.

The solar cell structure, i. e. the layer sequence, is responsible for or capable of the photovoltaic effect. The layers may be coated, or deposited, respectively, as thin layers by means of known vacuum deposition techniques such as PVD, CVD, PECVD, APCVD, all of which may be used in semiconductor technology.

Conventional thin-film solar cells usually comprise a transparent electrode layer, also called front electrode, deposited on a substrate. On top of this first electrode layer, a photoelectric conversion semiconductor layer formed of a thin amorphous and/or microcrystalline silicon film and a back electrode layer are usually deposited. Said back electrode may again comprise a transparent conductive layer as well as a reflector layer, a conductive and reflective metal layer or a technical equivalent thereof.

In detail, prior Art FIG. 1 shows a basic, simple photovoltaic cell 10 comprising a transparent substrate 12, with a layer of a transparent conductive oxide (TCO) 14 deposited thereon. This layer is also called front contact and acts as first electrode for the photovoltaic element. The combination of substrate 12 and front contact 14 is also known as superstrate. The next layer 16 acts as the active photovoltaic layer and exhibits three "sub-layers" forming a p-i-n junction. Said layer 16 comprises hydrogenated microcrystalline, nanocrystalline or amorphous silicon or a combination thereof. Sub-layer 18, which is arranged adjacent to the TCO front contact 14, is positively doped, the adjacent sub-layer 20 is intrinsic, and the final sub-layer 22 is negatively doped. In an alternative embodiment, the layer sequence p-i-n as described can be inverted to n-i-p. In this case, layer 16 is identified as n-layer, layer 20 again as intrinsic, layer 22 as p-layer.

Finally, the cell includes a rear contact layer 24, which also is called back contact. Additionally, a reflective layer 26 is provided. Alternatively a metallic back contact may be realized, which can combine the physical properties of back reflector 26 and back contact 24. For illustrative purposes, arrows indicate impinging light.

It is generally understood that when light, for example, solar radiation, impinges on a photoelectric device, e.g. a solar cell, electron-hole pairs are generated in the i-layer. The holes from the generated pair are directed towards the p-region and the electrons towards the n-region. The contacts are generally directly or indirectly in contact with the p- and n-regions. Current will flow through an external circuit connecting these contacts as long as light continues to generate electron-hole pairs.

Transparent conducting (TC) layers, to be used as layers 14 and/or 24 as described above, are thin film materials that combine optical transparency in the visible spectral range with electrical conductivity suitable for optoelectronic applications.

Numerous applications such as defrosting windows or transparent electrodes for flat panel displays, and solar cells use transparent conducting layers. It is usually mandatory in these applications to maximize both the conductance and the transmittance of transparent conducting layers.

Various processes may produce transparent conducting layers. The most commonly used techniques are: sputtering (PVD), chemical vapour deposition (CVD), pulsed laser deposition, spray pyrolysis, and wet dip deposition. These processes employ diverse materials as substrates, for instance glass, plastic foils or alike. These materials may be flexible, or rigid.

In order to improve the electrical conversion efficiency of a photovoltaic device, as much as possible of the impinging light shall be able to be absorbed within the active silicon layers.

Transparent conducting material properties, or high conductance combined with high transmittance, respectively, are generally difficult to achieve simultaneously because optical transparency in the visible range often may require materials with band gaps larger than 3.3 eV and such large band gap materials render carrier doping and thus high conductivity difficult to realize.

In addition to this fundamental limitation, fabrication processes usually induce defects in the layers that limit the transparency and the conductivity. Such defects are for instance: porosity, grain boundaries and impurity contamination.

Known from U.S. Pat. No. 6,420,644 B1 is a solar battery having a board with a surface and a plurality of spherical segments projecting from the board surface. To define the plurality of spherical segments, the board surface may be embossed. On top of the board, a first electrode made from chrome may be provided.

Known from U.S. 2005/0022860 A1 is a thin-film photovoltaic module. To improve the utilization of such a module, a plurality of substantially hemispheric protrusions is provided on a substrate. In case the substrate is a metallic substrate, the protrusions are formed by embossing a metal substrate. In case a plastic substrate is provided, the protrusions may be formed by injection molding.

SUMMARY

It is an object of the present invention to provide a method for coating a substrate which overcomes at least one of the deficiencies as set forth above.

It is a further object of the invention to provide a method of coating a substrate with may be used for forming a solar cell, the solar cell having an improved efficiency.

This object is achieved by a method according to claim 1. This object is furthermore achieved by a solar cell according to claim 9. Advantageous embodiments are given in the dependent claims.

The present invention relates to a method of coating a substrate with a zinc oxide film, the method comprising the steps of:
Providing a substrate with at least one substantially flat surface;
Subjecting said surface at least partially to a plasma-etching process;
Depositing a layer on said etched surface, the layer comprising zinc oxide.

Due to the plasma etching process, the substrate achieves a surface which is structured. It may be the basis for forming a solar cell, or solar modules, respectively. In detail, the structured substrate may be used for forming a thin-film solar cell.

According to the invention, the substrate is etched to get a defined morphology that changes the growth of transparent conducting layers simultaneously by improving their conductance compared to that deposited on a flat substrate.

A flat, or a substantially flat surface shall thereby mean a surface, which is not subjected to a process for introducing a defined structure. In detail, no deepenings, or protrusions are introduced, by embossing, or molding, for example.

By using a plasma-etching process, well defined structures may be achieved on the surface. This allows providing a structured surface having well defined properties. In detail, caused by the structured surface of the substrate, light, in particular solar light, which is transferred from the substrate to the active layers will be scattered. This will improve the absorbance of the light in the active phases and thus the efficiency of the solar cell comprising such a structured substrate.

Inventors have surprisingly found that the combination of a substrate, the surface of which is structured by a plasma-etching process, which in turn is coated with a zinc oxide layer will result in an improved conductivity of said zinc oxide layer. Without being bound to a certain theory it is assumed that these results are achieved by the beneficial synergistic effects of the above features. Especially, a combination of an excellent transparency together with an improved conductivity is achieved according to the invention.

Consequently, due to the fact the transparency as well as in particular the conductivity is improved by the special combination and the synergist effects of applying a plasma-etching process together with using a zinc oxide coating, a substrate coated according to the invention may very well be used as basis for manufacturing a solar cell.

In a preferred embodiment of the present invention, a glass substrate is used. A glass substrate has preferred properties which allows an efficient and well defined etching process in particular by using a plasma-etching process. In particular, by using a glass substrate, the surface of the substrate can be structured in a desired and well defined way by using smooth etching conditions.

The glass substrate can be any glass substrate known to the skilled person that is suitable for the manufacturing of thin-film devices. The thin-films layers according to the present invention can be deposited by various deposition techniques known to the skilled person.

In a further preferred embodiment of the present invention a plasma of a mixture of sulphur hexafluoride (SF6) and oxygen (O2) in a ratio of 5/1 is used. This mixture provides a plasma which may create a well defined structure, or morphology, respectively, of the surface of the substrate. In detail, especially in combination with a glass substrate this gas mixture is advantageous because of applying sulphur hexafluoride as an etching gas.

In a further preferred embodiment of the present invention, a power density of 1 W/cm$^2$ is used in the plasma-etching process. This power is low enough to realize energy saving reaction conditions. However, using an etching power like defined above, a reactive etching gas, or etching plasma, respectively, may be created to realize an effective etching process, so that the process may be performed at furthermore reasonable conditions.

In a further preferred embodiment of the present invention, a pressure of 30 mTorr is used during the etching process. This pressure allows especially smooth as well as effective reaction conditions for plasma-etching the substrate. Especially, for etching a glass substrate, this pressure is preferred.

In a further preferred embodiment of the present invention, the etching period lasts 30 minutes. Such a period of time is reasonable for structuring the surface of the substrate even in industrial processes, especially for manufacturing solar cells, or solar modules, respectively. However, this time may be suitable for achieving the required degree of etching, or the required morphology of the surface of the substrate, respectively.

In a further preferred embodiment of the present invention zinc oxide is deposited by low pressure vapour deposition (LPCVD). This process is preferred for coating the substrate especially with zinc oxide. This coating process allows providing a film of zinc oxide with high purity and also as a thin film, i.e. with very low thicknesses. Additionally, due to the fact that zinc oxide is used as transparent conductive oxide layer, is important that next to the conductivity like described above, the transparency reaches required values. This may be achieved by using a low pressure vapour deposition of zinc oxide.

However, other coating techniques are possible according to the invention, particularly chemical vapour deposition (CVD) or physical vapour deposition (PVD) such as a vacuum sputtering process. More preferably, the vapour deposition process is a plasma enhanced CVD (PECVD), and/or an atmospheric pressure CVD (APCVD).

In a further preferred embodiment, zinc oxide is doped with boron. Coating the substrate with a coated zinc oxide may even more improve the conductibility. Additionally, due to the doping process, particularly the electronical properties of the zinc oxide layer may be adjusted to the required application, especially for an application in a solar cell, or solar module, respectively.

The invention furthermore relates to a solar cell, comprising a substrate being coated with zinc oxide according to a method according to the invention. Especially by providing a solar cell with a substrate being coated according to the invention, the synergistic effects achievable are advantageous. In detail, the zinc oxide layer may be used as a transparent conductive oxide layer. With this regard, it is especially preferred that the zinc oxide layer has improved properties with respect to conductivity as well as transparency. Especially the conductivity is improved in a zinc oxide layer of a solar cell according to the invention. This allows the photovoltaic cell, or solar cell and solar module, respectively, according to the invention having an improved efficiency.

The method according to the present invention thus advantageously allows for an easy but highly effective method for increasing the efficiency, yield and throughput of thin-film device manufacturing, preferably solar cell manufacturing.

In a preferred embodiment of the present invention, the zinc oxide coating has a conductance of 14.5 Ohm-square or less. These values are very well achievable according to the invention. This feature allows providing a solar cell comprising a transparent conductive oxide layer having an especially improved conductivity and thus being very efficient.

As will be apparent to the skilled person, preferred embodiments of the method according to the present invention are derivable from the explanations detailed above regarding the inventive methods according to the present invention. However, in the following, more preferred embodiments of the method according to the present invention shall explicitly be disclosed.

BRIEF DESCRIPTION OF THE DRAWINGS

These and other aspects of the invention will be apparent from and elucidated with reference to the embodiments described hereinafter.

In the drawings.

DETAILED DESCRIPTION

Figure 1:
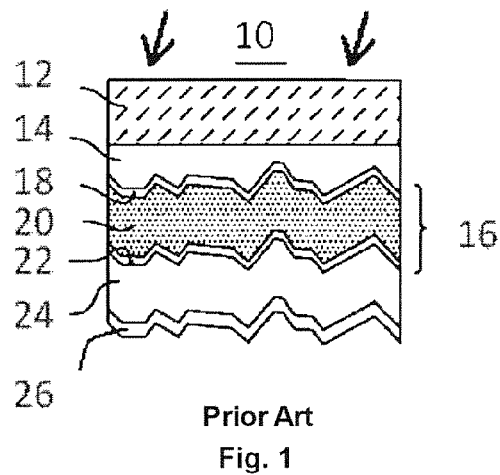
FIG. 1 shows a schematic representation of a thin-film solar cell according to the prior art.
Figures 2A, 2B:
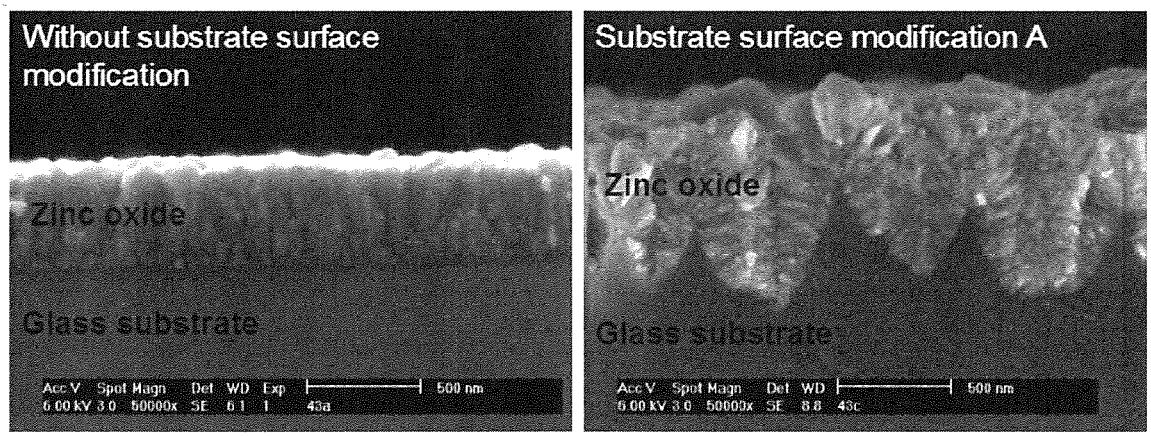
FIG. 2a shows a cross section scanning electron micrograph of a coated substrate according to the prior art.
FIG. 2b shows a cross section scanning electron micrograph of a coated substrate according to the invention.

FIG. 2a shows a cross-section scanning electron micrograph of a glass substrate being coated with zinc oxide according to the prior art. It can be seen that the surface of the substrate is flat, which means that it does not have any protrusions or deepenings. In detail, no surface modification was performed on that surface, by embossing, or molding, for example. On that flat surface, a layer of zinc oxide (ZnO) is deposited.

In contrast thereto, FIG. 2b shows a cross-section scanning electron micrograph of a glass substrate being coated with zinc oxide according to the invention. The upper part of the zinc oxide layer deposited on the glass substrate exhibits larger grains than the layer deposited on flat glass (FIG. 2a). These larger grains can explain the increased conductance of the zinc oxide layer on this substrate. In fact, materials with large grains show a higher conductivity than materials with small grains. Furthermore, large grains reduce optical transmission losses.

The presence of a rough interface between the substrate and the transparent material being achieved by a plasma-etching process according to the invention diffuses the light. This light diffusion is desired in solar cells applications in order to trap the light into active layers of the cells. Moreover, this rough interface also reduces the reflection of the incoming light at the interface between the glass surface and the zinc oxide layer, which leads to an increased transmittance.

These results show that a modification of the substrate surface morphology according to the invention affects the growth of zinc oxide layers and notably increase their conductance as well as their homogeneity, and transparency.

Figure 3:
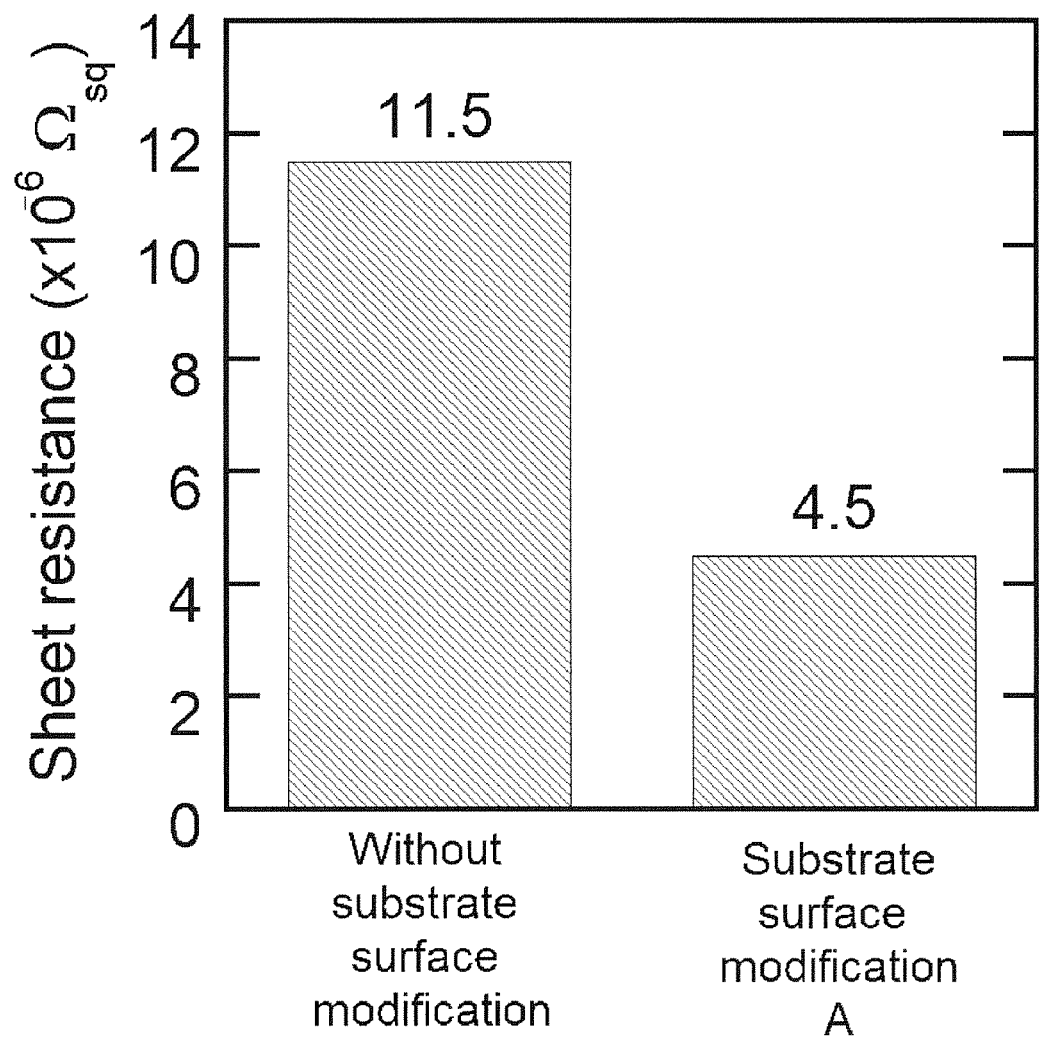
FIG. 3 shows a comparison of the sheet resistance of a zinc oxide coating according to the prior art and according to the invention.
Figure 4:
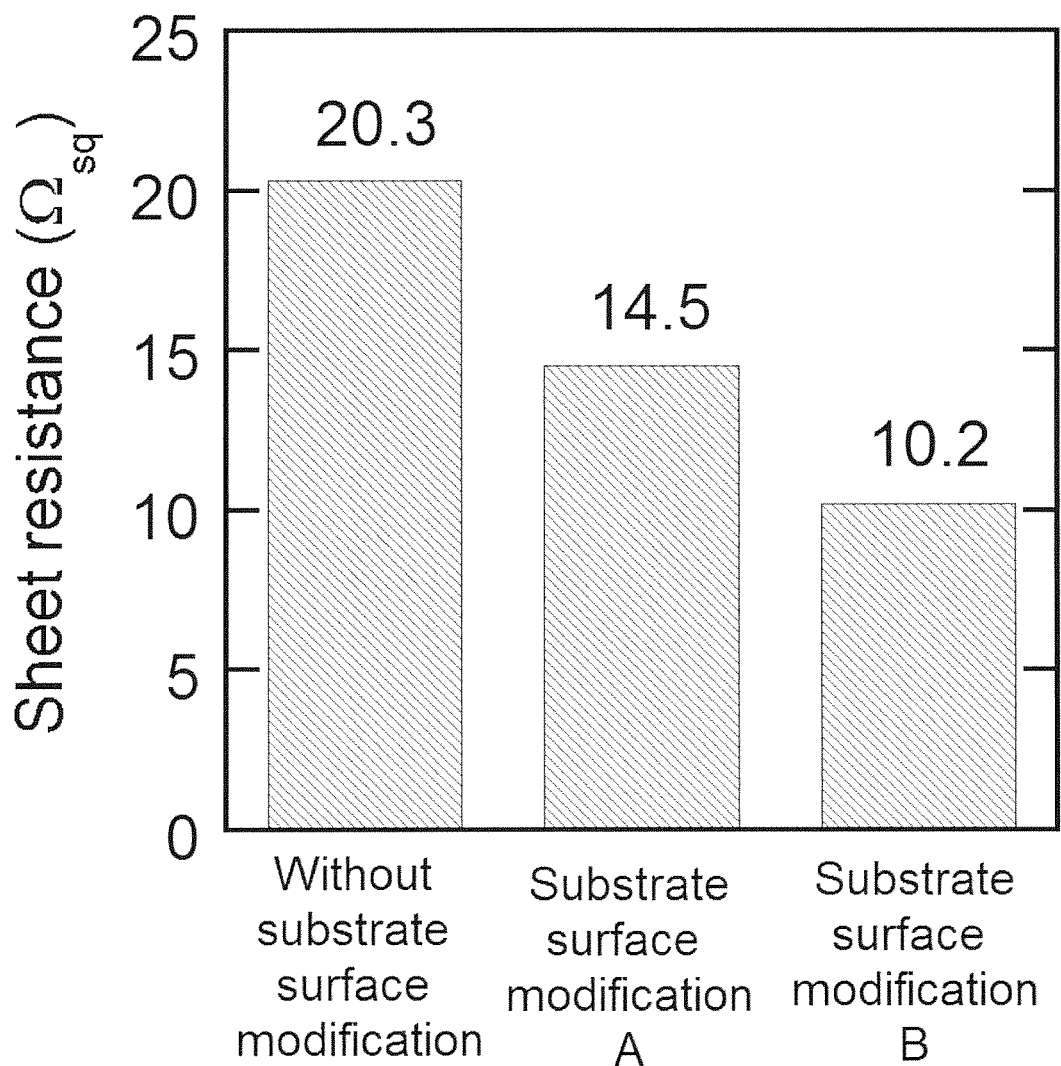
FIG. 4 shows a further comparison of the sheet resistance of a zinc oxide coating according to the prior art and according to the invention.

The effect achieved by performing the method according to the invention, and in detail the influence of the morphology of the surface of a glass substrate on the conductivity of two types of zinc oxide layers deposited on it is shown in FIGS. 3 and 4.

In detail, the following examples according to the invention were performed.

In all experiments, the surface of a Schott Borofloat 33 glass was etched in a reactive ion etcher (RIE) with a plasma of mixed oxygen (O2) and sulfur hexafluoride (SF6). The parameters applied during the RIE process are:

| Gas Flow Ratio $SF_6/O_2$ | Pressure | Power |
|---|---|---|
| 5 | 30 mTorr | 1000 W (about 1 W/cm$^2$) |

The glasses with a surface morphology obtained after 30 minutes etch impact are called "glass A", and after 120 minutes etch impact "glass B".

After introducing the structure, or morphology, respectively, into the surface of the substrate, two types of zinc oxides where deposited by low pressure chemical vapour deposition (LPCVD). Type 1 is a thin layer of about 500 nm of undoped zinc oxide (ZnO) deposited on flat and additionally on "glass A" substrate. Type 2 is a thin layer of about 1000 nm of boron doped zinc oxide (ZnO:B) deposited on "glass A" and additionally on "glass B" substrates. Each type is deposited on flat and on etched glass substrate simultaneously in the same deposition run, For all layers, the sheet resistances (Rsq) were measured with a four probe method. The sheet resistance is related to the conductance by the following formula:

$$G=1/R=W/(Rsq.L),$$

wherein G is the conductance, R is the resistance, and W and L respectively are the width and length of the layer.

FIG. 3 shows the sheet resistance values of zinc oxides type 1 co-deposited on a flat glass and "glass A". The sheet resistance of the layer decrease from $11.5 \times 10-6$ to $4.5 \times 10-6$ $\Omega$sq using "glass A" instead of flat glass.

FIG. 4 shows the sheet resistance values of zinc oxide type 2 co-deposited on a flat glass, "glass A" and "glass B". Compared to zinc oxide deposited in the flat glass, the sheet resistance of the layer decreases from 20.3 to 14.5 $\Omega$sq on "glass A" and from 20.3 to 10.2 $\Omega$sq on "glass B".

It was thus shown that by performing a method according to the invention, the conductivity of the zinc oxide layer was remarkably improved. The method according to the invention is thus particularly suitable for manufacturing a photovoltaic element or a solar cell, respectively, having an improved efficiency.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

Brief Description of the Reference Numerals of the Drawings:

10 photovoltaic cell
12 substrate
14 front contact
16 layer
18 sub-layer
20 sub-layer
22 sub-layer
24 contact layer
26 reflective layer

The invention claimed is:

1. A method of coating a substrate with a zinc oxide film, the method comprising:
    providing a glass substrate with a surface that is substantially flat;
    subjecting said surface at least partially to a plasma-etching process that uses a plasma of a mixture of sulphur hexafluoride and oxygen in a ratio of 5/1, thus yielding an etched surface; and
    depositing on said etched surface, a layer comprising zinc oxide, wherein the zinc oxide is deposited by low pressure vapour deposition.

2. The method of claim 1, wherein the plasma-etching process uses a power density of about 1 W/cm$^2$.

3. The method of claim 1, wherein the plasma-etching process uses a pressure of 30 mTorr.

4. The method of claim 1, wherein the etching period plasma-etching process lasts about 30 minutes.

5. The method of claim 1, wherein the zinc oxide is doped with boron.

* * * * *